United States Patent
Matsuura et al.

(10) Patent No.: US 8,488,497 B2
(45) Date of Patent: Jul. 16, 2013

(54) TRANSMISSION CIRCUIT AND TRANSMISSION METHOD

(75) Inventors: Toru Matsuura, Osaka (JP); Kenichi Mori, Osaka (JP); Wayne S. Lee, San Mateo, CA (US); Akihiko Matsuoka, Kanagawa (JP)

(73) Assignee: Panasonic Corporation, Osaka (JP)

( * ) Notice: Subject to any disclaimer, the term of this patent is extended or adjusted under 35 U.S.C. 154(b) by 422 days.

(21) Appl. No.: 12/813,407

(22) Filed: Jun. 10, 2010

(65) Prior Publication Data

US 2011/0305171 A1  Dec. 15, 2011

(51) Int. Cl.
*H04B 7/005* (2006.01)
*H04B 7/01* (2006.01)
*H04L 7/033* (2006.01)

(52) U.S. Cl.
CPC . *H04B 7/01* (2013.01); *H04L 7/033* (2013.01)
USPC .......................................... 370/278; 375/375

(58) Field of Classification Search
USPC ........... 370/254, 277, 503, 278; 375/372–376
See application file for complete search history.

(56) References Cited

U.S. PATENT DOCUMENTS

| | | | |
|---|---|---|---|
| 2005/0185747 A1* | 8/2005 | White | 375/375 |
| 2007/0110184 A1 | 5/2007 | Liang et al. | |
| 2007/0149148 A1 | 6/2007 | Yoshikawa et al. | |
| 2008/0150588 A1* | 6/2008 | Lin | 327/12 |

OTHER PUBLICATIONS

Raab, F. H., "High-Efficiency L-Band Kahn-Technique Transmitter", 1998 IEEE MTT-S Int. Microwave Symp. Digest, pp. 585-588.

* cited by examiner

*Primary Examiner* — Pao Sinkantarakorn
*Assistant Examiner* — Richard K Chang

(57) ABSTRACT

A transmission circuit that performs modulation based on a phase difference signal and an amplitude signal includes an asymmetrical phase rotation device. The asymmetrical phase rotation device performs an operation of subtracting $2\pi$ from a value of the phase difference signal when the value of the phase difference signal is greater than a predetermined positive threshold value, or an operation of adding $2\pi$ to the value of the phase difference signal when the value of the phase difference signal is less than a predetermined negative threshold value. Accordingly, the transmission circuit has distortion reduction characteristics improved uniformly over a range of frequencies higher or lower than a carrier wave band.

11 Claims, 14 Drawing Sheets

TRANSMISSION CIRCUIT AND TRANSMISSION METHOD

BACKGROUND OF THE INVENTION

1. Field of the Invention

The present invention relates to a transmission circuit to be used in radio communication devices such as mobile phones and wireless LAN devices.

2. Description of the Background Art

Conventionally, one of the known modulation methods used for a transmission circuit of a radio communication device is one in which an input signal is separated into an amplitude component signal and a phase component signal, and modulation is performed based on these signals to generate a transmission signal. An example of such a known modulation method is a polar modulation method disclosed by Non Patent Document 1.

FIG. 13 is a block diagram showing a configuration example of a conventional transmission circuit 1201 to which the polar modulation method is applied. The transmission circuit 1201 includes input terminals 1202 and 1203, a coordinate system converter 1204, LPFs (low-pass filters) 1205 and 1206, an angle modulator 1207, an amplitude modulator 1208, and an output terminal 1209.

An I signal (an in-phase signal) and a Q signal (a quadrature-phase signal) are inputted into the coordinate system converter 1204 via the input terminal 1202 and the input terminal 1203, respectively. The coordinate system converter 1204 generates an amplitude signal and a phase signal based on the I signal and the Q signal, respectively. The amplitude signal is inputted into the amplitude modulator 1208 after being band-limited by the LPF 1205. Also, the phase signal is inputted into the angle modulator 1207 after being band-limited by the LPF 1206. The angle modulator 1207 performs angle modulation based on the phase signal, thereby generating an angle-modulated signal. The angle-modulated signal is inputted into the amplitude modulator 1208. Based on the inputted amplitude signal, the amplitude modulator 1208 performs amplitude modulation on the angle-modulated signal to generate a transmission signal, and outputs the transmission signal via the output terminal 1209.

CITATION LIST

Non-Patent Document

Non-Patent Document 1: F. H. Raab et al., "High-Efficiency L-Band Kahn-Technique Transmitter", 1998, IEEE MTT-S Int. Microwave Symp. Dig.

SUMMARY OF THE INVENTION

FIG. 14 shows spectra of the transmission signal of the transmission circuit 1201. In FIG. 14, the horizontal axis represents frequency and the vertical axis represents power. In FIG. 14, a solid line represents the spectrum of the transmission signal in the case where the LPFs 1205 and 1206 used in the transmission circuit 1201 each have a high cutoff frequency, and a dashed line represents the spectrum of the transmission signal in the case where the LPFs 1205 and 1206 used in the transmission circuit 1201 each have a low cutoff frequency. In either case, the power is peaked in a predetermined carrier wave band assigned to the transmission signal, and the power decreases on the higher and lower frequency sides with respect to the predetermined carrier wave band. The shape of each spectrum is substantially symmetrical. In a band near the carrier wave band, the power and distortion are less in the case of the high cutoff frequencies than in the case of the low cutoff frequencies. However, in a frequency band that is higher or lower than the carrier wave band and that is distant from the carrier wave band, the power and distortion are less in the case of the low cutoff frequencies than in the case of the high cutoff frequencies. Thus, there is a trade-off relationship between a band near the carrier wave band assigned to the transmission signal and a band distant from the carrier wave band, in terms of distortion reduction and noise reduction. For this reason, it has been difficult to uniformly improve distortion reduction characteristics over a range of frequencies higher or lower than the carrier wave band.

Therefore, an object of the present invention is to provide a transmission circuit with distortion reduction characteristics improved uniformly over a range of frequencies higher or lower than the carrier wave band.

In order to achieve the above object, the present invention has features described below. The phase difference signals, corresponding values and arithmetic operations described herein are understood to be expressed in radians, as is known in the art. A first aspect of the present invention is an asymmetrical phase rotation device, into which a phase difference signal indicating change amounts of a phase signal for respective predetermined periods is inputted, for performing an operation on the phase difference signal and outputting a resultant signal. The asymmetrical phase rotation device performs one of an operation of subtracting $2\pi$ from a value of the phase difference signal when the value of the phase difference signal is greater than a predetermined positive threshold value and an operation of adding $2\pi$ to the value of the phase difference signal when the value of the phase difference signal is less than a predetermined negative threshold value.

When performing the operation of subtracting $2\pi$ from the value of the phase difference signal, the asymmetrical phase rotation device may further perform an operation of adding a positive value to a predetermined number of values of the phase difference signal that precede the value of the phase difference signal and adding a positive value to a predetermined number of values of the phase difference signal that follow the value of the phase difference signal, the total of the positive values being $2\pi$. When performing the operation of adding $2\pi$ to the value of the phase difference signal, the asymmetrical phase rotation device may further perform an operation of subtracting a positive value from a predetermined number of values of the phase difference signal that precede the value of the phase difference signal and subtracting a positive value from a predetermined number of values of the phase difference signal that follow the value of the phase difference signal, the total of the positive values being $2\pi$.

The asymmetrical phase rotation device may include an amplitude reduction unit that performs an operation on an amplitude signal inputted thereinto and outputs a resultant signal. The amplitude reduction unit may perform an operation of reducing an amplitude of the amplitude signal when the operation of subtracting $2\pi$ from the value of the phase difference signal or the operation of adding $2\pi$ to the value of the phase difference signal has been performed.

The present invention is also directed to a transmission circuit that uses an asymmetrical phase rotation device. That is, a second aspect of the present invention is a transmission circuit for modulating an input signal to generate a transmission signal and outputting the transmission signal. The transmission circuit includes: a coordinate system converter that separates the input signal into a phase signal and an amplitude signal, generates a phase difference signal based on a change in the phase signal, and outputs the phase difference signal and the amplitude signal; an asymmetrical phase rotation unit into which the phase difference signal is inputted and which performs one of an operation of subtracting $2\pi$ from a value of the phase difference signal when the value of the phase difference signal is greater than a predetermined positive threshold value and an operation of adding $2\pi$ to the value of the phase difference signal when the value of the phase difference signal is less than a predetermined negative threshold value; an angle modulator that performs, based on the phase difference signal outputted from the asymmetrical phase rotation unit, angle modulation to generate an angle-modulated signal, and outputs the angle-modulated signal; and an amplitude modulator that performs, based on an amplitude represented by the amplitude signal, amplitude modulation on the angle-modulated signal to generate the transmission signal, and outputs the transmission signal. When performing the operation of subtracting $2\pi$ from the value of the phase difference signal, the asymmetrical phase rotation unit may further perform an operation of adding a positive value to a predetermined number of values of the phase difference signal that precede the value of the phase difference signal and adding a positive value to a predetermined number of values of the phase difference signal that follow the value of the phase difference signal, the total of the positive values being $2\pi$. When performing the operation of adding $2\pi$ to the value of the phase difference signal, the asymmetrical phase rotation unit may further perform an operation of subtracting a positive value from a predetermined number of values of the phase difference signal that precede the value of the phase difference signal and subtracting a positive value from a predetermined number of values of the phase difference signal that follow the value of the phase difference signal, the total of the positive values being $2\pi$. The asymmetrical phase rotation unit may include an amplitude reduction unit into which the amplitude signal is inputted and which performs an operation on the amplitude signal and outputs a resultant signal. The amplitude reduction unit may perform an operation of reducing the amplitude of the amplitude signal when the operation of subtracting $2\pi$ from the value of the phase difference signal or the operation of adding $2\pi$ to the value of the phase difference signal has been performed.

A third aspect of the present invention is a transmission circuit for modulating an input signal to generate a transmission signal and outputting the transmission signal. The transmission circuit includes: a coordinate system converter that separates the input signal into a phase signal and an amplitude signal, generates a phase difference signal based on a change in the phase signal, and outputs the phase difference signal and the amplitude signal; an asymmetrical phase rotation unit into which the phase difference signal is inputted and which performs one of an operation of subtracting $2\pi$ from a value of the phase difference signal when the value of the phase difference signal is greater than a predetermined positive threshold value and an operation of adding $2\pi$ to the value of the phase difference signal when the value of the phase difference signal is less than a predetermined negative threshold value; an asymmetrical nonlinear phase reduction unit into which the phase difference signal outputted from the asymmetrical phase rotation unit is inputted and which performs an operation of replacing, when a value of the phase difference signal is greater than a predetermined positive threshold value, the value of the phase difference signal with the predetermined positive threshold value, and an operation of adding a positive value to a predetermined number of values of the phase difference signal that precede the replaced value of the phase difference signal and adding a positive value to a predetermined number of values of the phase difference signal that follow the replaced value of the phase difference signal, the total of the positive values being equal to a difference value between the replaced value of the phase difference signal and the predetermined positive threshold value, and an operation of replacing, when a value of the phase difference signal is less than a predetermined negative threshold value, the value of the phase difference signal with the predetermined negative threshold value, and an operation of subtracting a positive value from a predetermined number of values of the phase difference signal that precede the replaced value of the phase difference signal and subtracting a positive value from a predetermined number of values of the phase difference signal that follow the replaced value of the phase difference signal, the total of the positive values being equal to a difference value between the replaced value of the phase difference signal and the predetermined negative threshold value; an angle modulator that performs, based on the phase difference signal that is outputted from the asymmetrical nonlinear phase reduction unit and that has been subjected to phase reduction processing by the asymmetrical nonlinear phase reduction unit, angle modulation to generate an angle-modulated signal, and outputs the angle-modulated signal; and an amplitude modulator that performs, based on an amplitude represented by the amplitude signal, amplitude modulation on the angle-modulated signal to generate the transmission signal, and outputs the transmission signal.

A fourth aspect of the present invention is directed to a transmission circuit that is based on the transmission circuit of the third aspect. The transmission circuit of the fourth aspect includes not an asymmetrical phase rotation unit but an asymmetrical nonlinear phase reduction unit that uses a positive threshold value and a negative threshold value that have different absolute values from each other. The fourth aspect of the present invention is also directed to an asymmetrical nonlinear phase reduction unit that uses a positive threshold value and a negative threshold value that have different absolute values from each other.

Other aspects of the present invention are: a transmission signal generation method used by the above-described transmission circuit; a radio communication device that uses the above-described transmission circuit; and an integrated circuit that integrates, at least partly, functions of the radio communication device.

The present invention makes it possible to provide a transmission circuit with distortion reduction characteristics improved uniformly over a range of frequencies higher or lower than the carrier wave band.

The present invention is applicable to a transmission circuit and useful for communication devices such as mobile phones and wireless LAN devices.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the drawings.

First Embodiment

Figure 1:
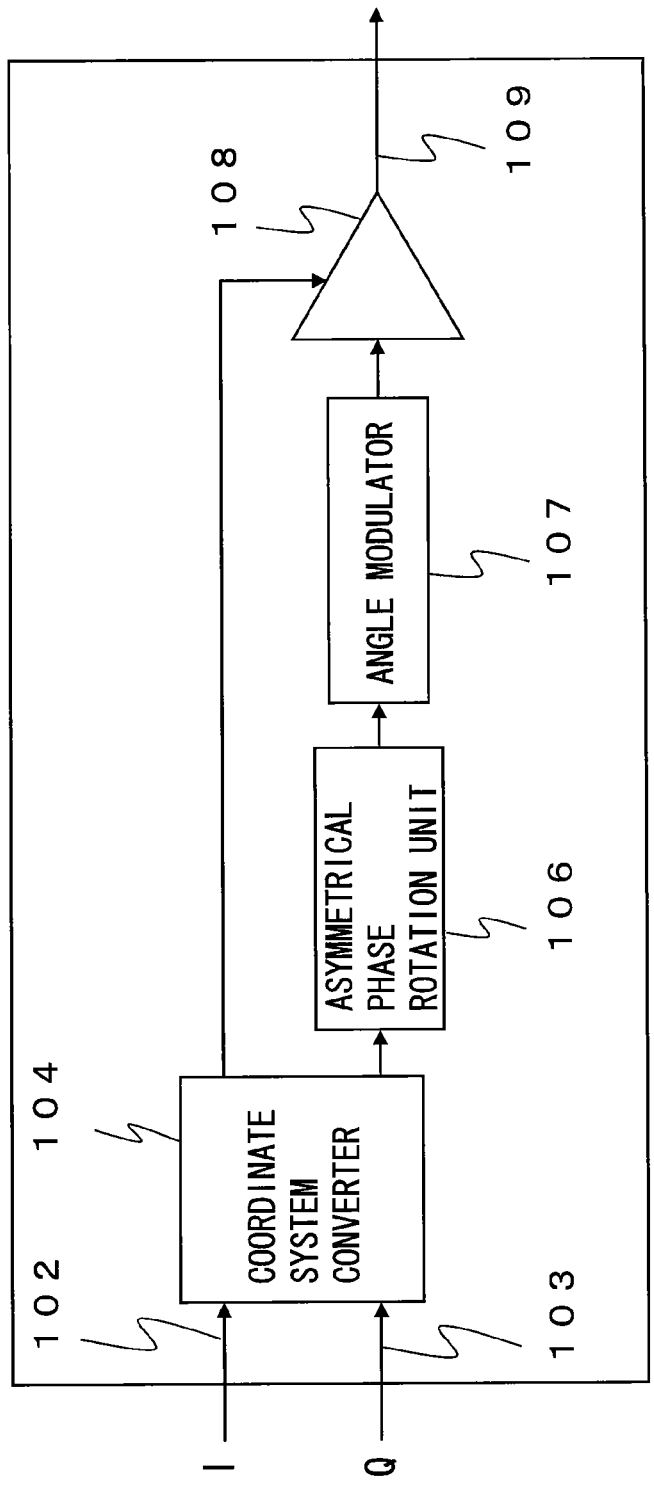
FIG. 1 shows a configuration of a transmission circuit according to a first embodiment of the present invention.

A first embodiment of the present invention is described below with reference to FIG. 1 to FIG. 4. FIG. 1 is a block diagram showing a configuration of a transmission circuit 101 according to the first embodiment. The transmission circuit 101 includes input terminals 102 and 103, a coordinate system converter 104, an asymmetrical phase rotation unit 106, an angle modulator 107, an amplitude modulator 108, and an output terminal 109. Although not shown, the transmission circuit 101 includes a controller that performs control for, for example, power supply to and synchronization of these components, and includes signal wiring. Typically, the amplitude modulator 108 is realized by a power amplifier.

An I signal and a Q signal are inputted into the coordinate system converter 104 via the input terminal 102 and the input terminal 103, respectively. The coordinate system converter 104 generates an amplitude signal and a phase signal based on the I signal and the Q signal, respectively, and calculates a difference between a most recently generated phase signal and a phase signal generated immediately previously to the most recently generated phase signal, thereby generating a phase difference signal. The coordinate system converter 104 then outputs the amplitude signal and the phase difference signal. The amplitude signal is inputted into the amplitude modulator 108. The phase difference signal is inputted into the angle modulator 107 after the asymmetrical phase rotation unit 106 has performed an operation on the phase difference signal. The operation performed by the asymmetrical phase rotation unit 106 will be described below. The angle modulator 107 integrates the phase difference signal on which the operation has been performed, and performs angle modulation based on a phase signal obtained from the integration, thereby generating an angle-modulated signal. The angle-modulated signal is inputted into the amplitude modulator 108. Based on the amplitude signal inputted into the amplitude modulator 108, the amplitude modulator 108 performs amplitude modulation on the angle-modulated signal to generate a transmission signal, and outputs the transmission signal via the output terminal 109. Here, FIG. 1 shows the configuration in which LPFs are not provided. However, as with the conventional transmission circuit 1201, LPFs may be provided, for example, at the output of the coordinate system converter 104, as necessary.

Next, the operation performed by the asymmetrical phase rotation unit 106 is described. Generally speaking, a reception signal which a mobile terminal receives from a base station has a frequency band assigned thereto that is higher than a frequency band assigned to a transmission signal which the mobile terminal transmits to the base station. In this situation, in order to prevent interference with the reception signal, the transmission signal is required to have better low-distortion/low-noise characteristics on the higher frequency side than on the lower frequency side. The present embodiment assumes a case where the transmission circuit 101 is used in such a mobile terminal, for example, a mobile phone. Accordingly, in the present embodiment, the asymmetrical phase rotation unit 106 performs the operation on the phase difference signal in order to uniformly reduce the distortion on the higher frequency side.

When the phase difference signal indicates a positive value, this indicates a phase lead and an increased frequency of the angle-modulated signal. In contrast, when the phase difference signal indicates a negative value, this indicates a phase lag and a decreased frequency of the angle-modulated signal. Accordingly, a steep change in the phase signal results in a widened spectrum of the angle-modulated signal. This consequently causes the spectrum of the transmission signal to be widened. Therefore, the asymmetrical phase rotation unit 106 performs the operation such that the phase difference signal does not have a large positive value, thereby preventing the spectrum of the angle-modulated signal and the transmission signal from being widened to the higher frequency side.

Figure 2:
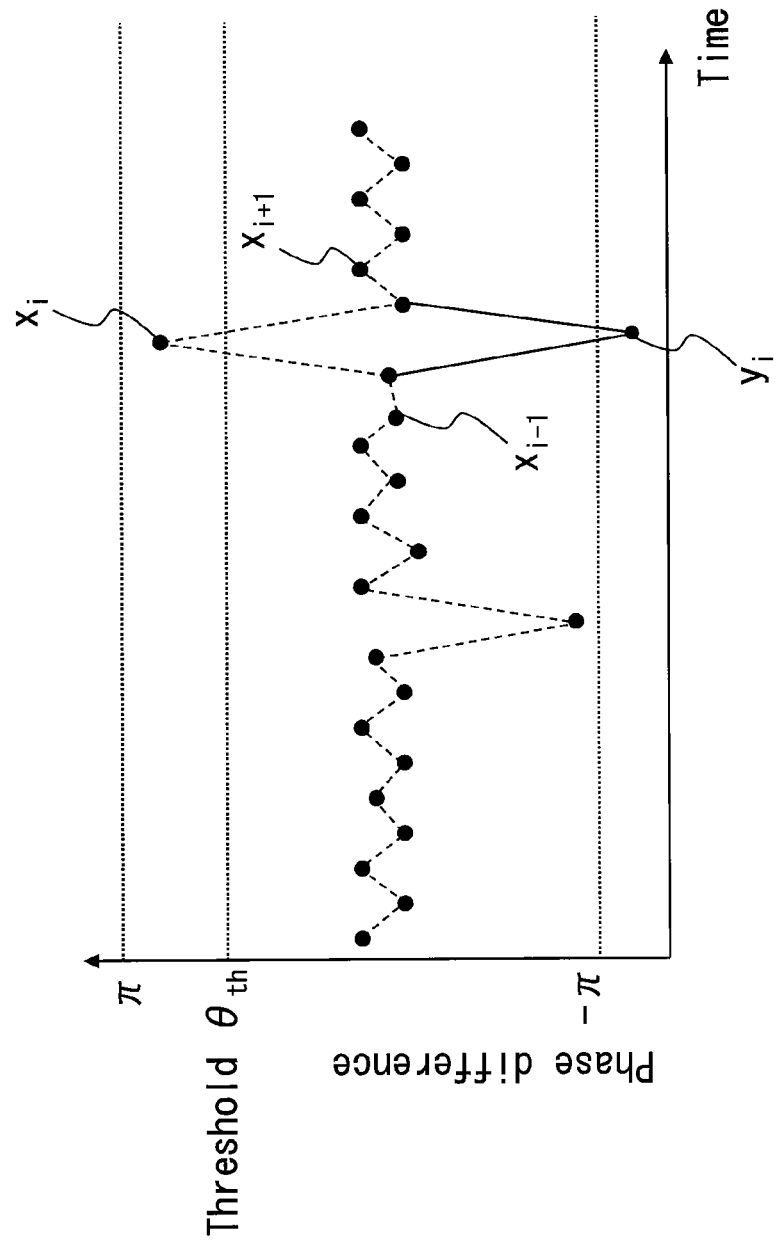
FIG. 2 shows an operation performed by the transmission circuit according to the first embodiment of the present invention.

FIG. 2 illustrates an operation which the asymmetrical phase rotation unit 106 performs on the phase difference signal. In FIG. 2, the horizontal axis represents time and the vertical axis represents phase difference. Points connected with dashed lines represent values $x_n$ (n=1, 2, 3 . . . ) of the phase difference signal inputted into the asymmetrical phase rotation unit 106. These values are obtained at different time points, respectively. These values are within $-\pi$ to $\pi$. The asymmetrical phase rotation unit 106 performs the below operation for each n, based on each value $x_n$ and a predetermined threshold value $\theta_{th}$ ($\pi > \theta_{th} > 0$), and outputs a resultant value $y_n$.

If $x_n > \theta_{th}$ $y_n = x_n - 2\pi$

If $x_n \leq \theta_{th}$ $y_n = x_n$  [equation 1]

Thus, when $x_n$ is greater than the threshold value $\theta_{th}$, the asymmetrical phase rotation unit 106 outputs a value that is obtained by subtracting $2\pi$ from $x_n$. This process of correcting the phase difference signal is hereinafter referred to as phase rotation. When $x_n$ is equal to or less than the threshold value $\theta_{th}$, the asymmetrical phase rotation unit 106 outputs the value $x_n$ as it is. FIG. 2 shows a case where $x_i$ is greater than $\theta_{th}$. In this case, the asymmetrical phase rotation unit 106 outputs $y_i$ ($=x_i-2\pi$) instead of $x_i$, along with the values of the phase difference signal other than $x_i$ as they are.

Figure 3:
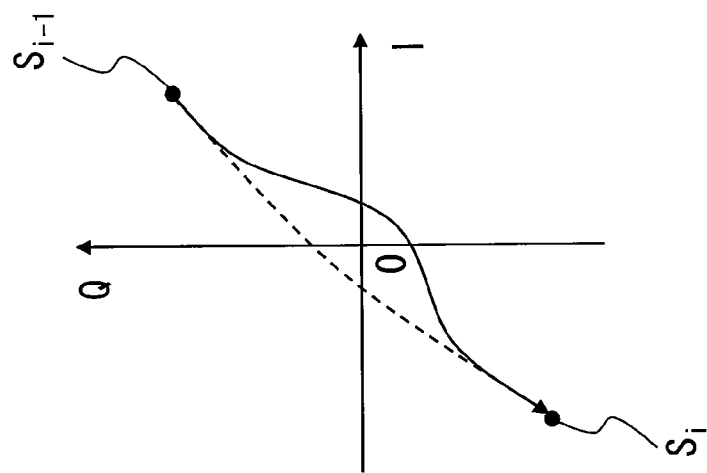
FIG. 3 shows tracks of output signals of the transmission circuit according to the first embodiment of the present invention.

FIG. 3 shows tracks of transmission signals by connecting sample points on an IQ plane with smooth lines, the sample points representing values of the transmission signals which have been measured at multiple time points during a period in which each transmission signal has transitioned from the i−1th symbol $S_{i-1}$ to the ith symbol $S_i$. Here, the IQ plane is illustrated assuming that the counterclockwise direction with respect to the origin of the IQ plane is the positive direction of the phase of a transmission signal. As shown in FIG. 3, if a transmission signal transitions from the symbol $S_{i-1}$ to the symbol $S_i$ with a phase difference $x_i$, then the path becomes counterclockwise with respect to the origin as indicated by a dashed line. Accordingly, high frequency components of the transmission signal increase. On the other hand, if a transmission signal transitions from the symbol $S_{i-1}$ to the symbol $S_i$ with a phase difference $y_i$, the path becomes clockwise with respect to the origin as indicated by a solid line. Accordingly, the rotational direction of the phase is inverted, and thereby high frequency components of the transmission signal are prevented from increasing.

Figure 4:
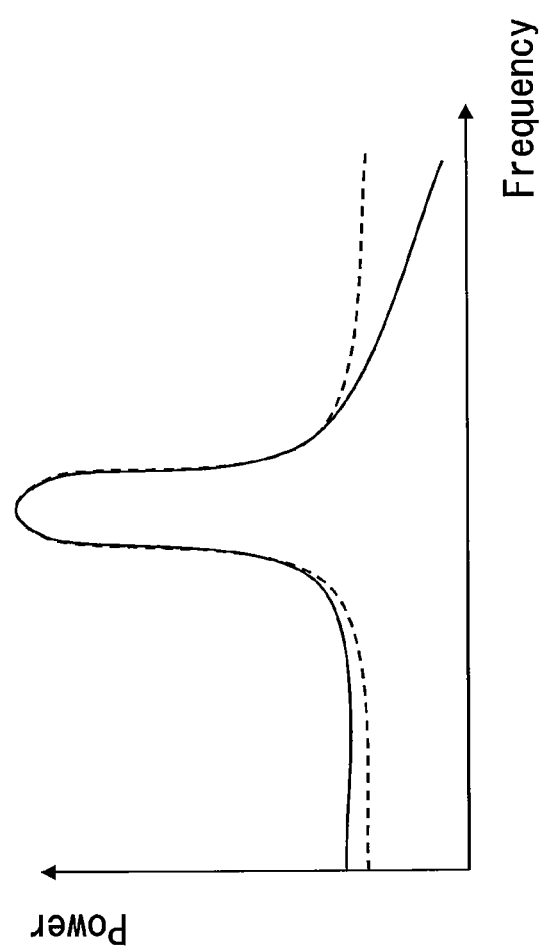
FIG. 4 shows power spectra of the output signals of the transmission circuit according to the first embodiment of the present invention.

FIG. 4 shows, by way of a solid line, the spectrum of a transmission signal in the case where the operation as described above is performed, and shows, by way of a dashed line, the spectrum of a transmission signal in the case where the operation as described above is not performed. Owing to the operation performed by the asymmetrical phase rotation unit 106, the distortion on the higher frequency side for which low-distortion characteristics are strictly required is decreased in a band near the carrier wave band as well as in a band distant from the carrier wave band. The distortion on the lower frequency side for which low distortion characteristics are not strictly required is, however, increased.

It has been described that the asymmetrical phase rotation unit 106 performs the operation such that the phase difference signal does not have a large positive value, thereby reducing the distortion on the higher frequency side. However, as an alternative, the asymmetrical phase rotation unit 106 may perform the operation such that the phase difference signal does not have a negative value whose absolute value is large. In this manner, the distortion on the lower frequency side can be reduced. In this case, the asymmetrical phase rotation unit 106 performs the below operation for each n, based on each value $x_n$ and a predetermined threshold value $\theta_{th}$ ($-\pi<\theta_{th}<0$), and outputs a resultant value $y_n$.

If $x_n < \theta_{th}$ $y_n = x_n + 2\pi$

If $x_n \geq \theta_{th}$ $y_n = x_n$ [equation 2]

Second Embodiment

A transmission circuit 201 according to a second embodiment of the present invention is different from the transmission circuit 101 of the first embodiment in that the transmission circuit 201 includes, instead of the asymmetrical phase rotation unit 106, an asymmetrical phase rotation unit 206 that performs an operation different from that performed by the asymmetrical phase rotation unit 106. The transmission circuit 201 has the same block configuration as that shown in FIG. 1, and therefore is not shown.

In the first embodiment, between the phase difference signal generated by the coordinate system converter 104 based on the input signal, and the phase difference signal subjected to the operation by the asymmetrical phase rotation unit 106 and inputted into the angle modulator 107, the phases, that is, the integral values of the phase difference signals, may not coincide with each other. This may cause EVM (Error Vector Magnitude, i.e., modulation accuracy) of the angle modulation performed by the angle modulator 107 to decrease depending on the characteristics of an integrating circuit provided within the angle modulator 107.

Figure 5:
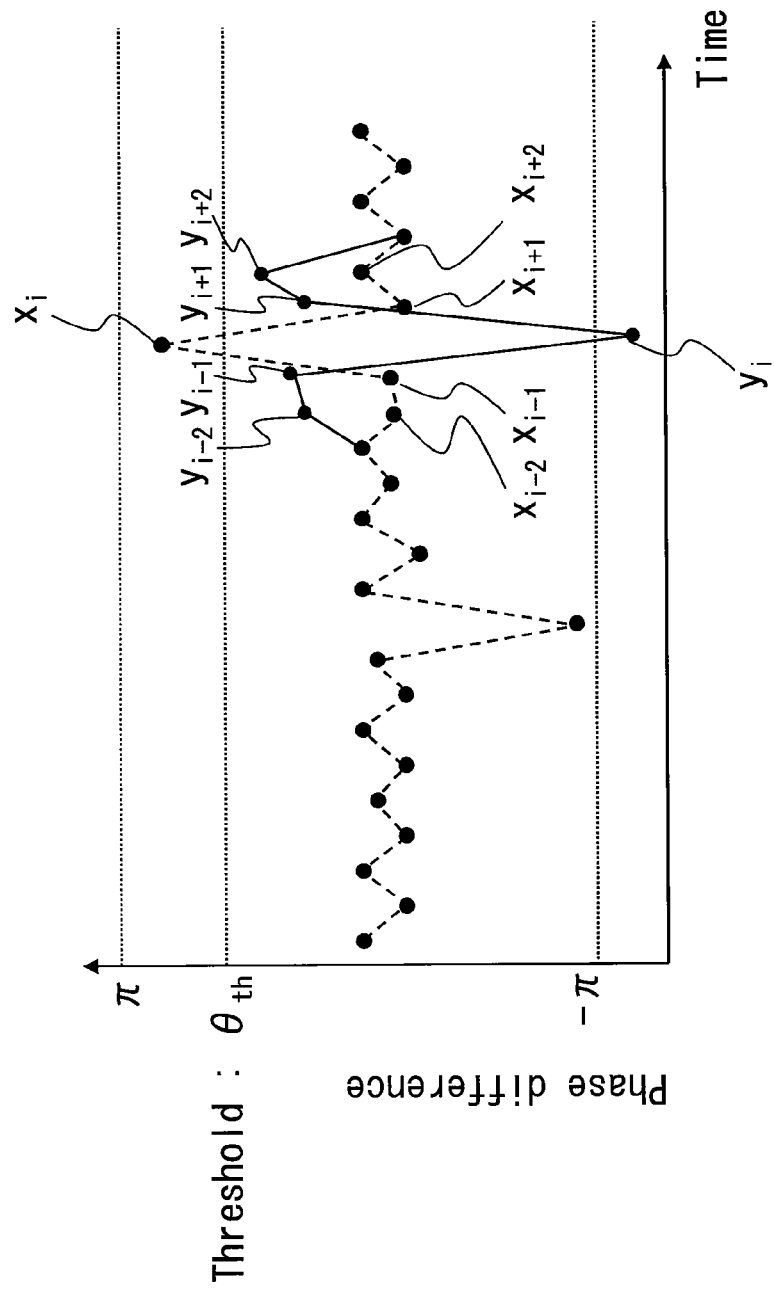
FIG. 5 shows an operation performed by a transmission circuit according to a second embodiment of the present invention.

FIG. 5 illustrates the operation which the asymmetrical phase rotation unit 206 performs on the phase difference signal. The asymmetrical phase rotation unit 206 performs the below operation for each n, based on each value $x_n$ and a predetermined threshold value $\theta_{th}$ ($\pi>\theta_{th}>0$), and outputs a resultant value $y_n$.

If [equation 3]

$x_n > \theta_{th}$ $y_n = x_n - 2\pi$ $y_{n+k} = x_{n+k} + \dfrac{\pi}{m}$ (wherein $k = -m, -m+1, \ldots, -1, 1, \ldots, m-1, m$)

If $x_n \leq \theta_{th}$ $y_n = x_n$

Here, m is a predetermined positive integer. FIG. 5 shows a case where m=2 and $x_i$ is greater than $\theta_{th}$. In this case, the asymmetrical phase rotation unit 206 outputs $y_i$ ($=x_i-2\pi$) instead of $x_i$. Also, the asymmetrical phase rotation unit 206 outputs, as two values of the phase difference signal which precede $x_i$ and as two values of the phase difference signal which follow $x_i$, values that result from adding $\pi/2$ to each of their original values. Accordingly, an integral value based on $y_n$ is compensated for, so as to coincide with an integral value based on $x_n$ when integration has been performed over a range up to n=i+2. As a result, a favorable EVM can be obtained for the angle modulation performed by the angle modulator 107. Note that in order for the asymmetrical phase rotation unit 206 to be able to perform the operation on the values of $x_{i-2}$ and $x_{i-1}$ based on the value of $x_i$, the asymmetrical phase rotation unit 206 may include a delay circuit. Further, if the value of m is small, there is a possibility that each $y_{n+k}$ ($=x_{n+k}+\pi/m$, k=−m, ..., −1, 1, ..., m) exceeds the threshold value $\theta_{th}$. Therefore, the value of m is not limited to 2, but may be set to a greater value that does not cause the occurrence of such a situation. The foregoing description gives an example in which in order to compensate for the subtraction of $2\pi$ from $x_i$, the sum of values added to the values of the phase difference signal that precede $x_i$ and the sum of values added to the values of the phase difference signal that follow $x_i$ are both $\pi$. However, the sum of values added to the values of the phase difference signal that precede $x_i$ and the sum of values added to the values of the phase difference signal that follow $x_i$ need not be equal to each other as long as the total sum of the added values is $2\pi$.

The above-described operation is intended for reducing the distortion on the higher frequency side. In the case where distortion reduction on the lower frequency side is required, the asymmetrical phase rotation unit 206 may perform the below operation for each n, based on each value $x_n$ and a predetermined threshold value $\theta_{th}$ ($-\pi < \theta_{th} < 0$), and output a resultant value $y_n$.

If [equation 4]

$$x_n > \theta_{th}$$

$$y_n = x_n + 2\pi$$

$$y_{n+k} = x_{n+k} - \frac{\pi}{m}$$

(wherein $k = -m, -m+1, \ldots, -1, 1, \ldots, m-1, m$)

If $$x_n \geq \theta_{th}$$

$$y_n = x_n$$

Third Embodiment

Figure 6:
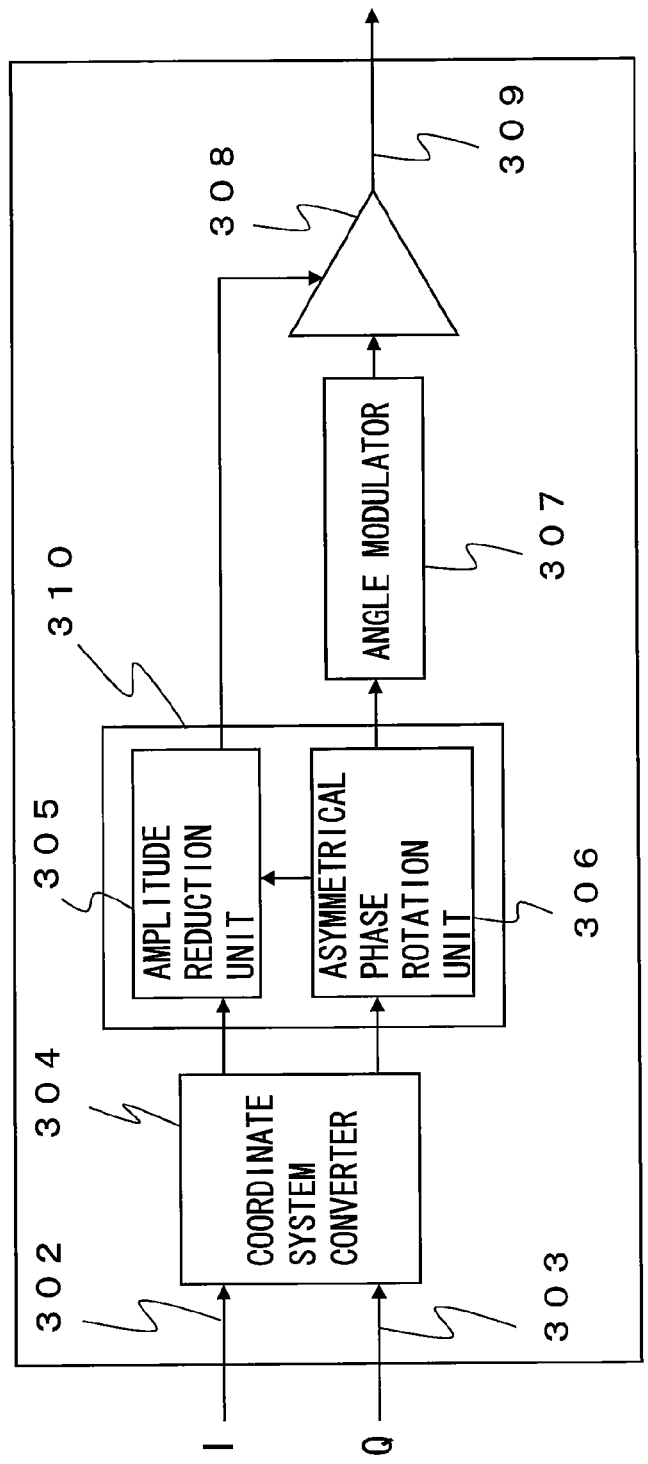
FIG. 6 shows a configuration of a transmission circuit according to a third embodiment of the present invention.

FIG. 6 is a block diagram showing a transmission circuit 301 according to a third embodiment of the present invention. The transmission circuit 301 includes input terminals 302 and 303, a coordinate system converter 304, an amplitude reduction unit 305, an asymmetrical phase rotation unit 306, an angle modulator 307, an amplitude modulator 308, and an output terminal 309. Among these components, the input terminals 302 and 303, the coordinate system converter 304, the angle modulator 307, the amplitude modulator 308, and the output terminal 309 are the same as the components of the transmission circuit 101 according to the first embodiment. Therefore, the description thereof will be omitted.

The asymmetrical phase rotation unit 306 outputs, when performing phase rotation on the phase difference signal inputted thereinto, a phase rotation notification signal to the amplitude reduction unit 305 for notifying the amplitude reduction unit 305 of the phase rotation having been performed. The present embodiment performs the phase rotation as represented by (equation 1). The amplitude reduction unit 305 receives the amplitude signal outputted from the coordinate system converter 304. When receiving the phase rotation notification signal, the amplitude reduction unit 305 reduces the magnitude of the amplitude of the amplitude signal, and outputs the resultant signal. When not receiving the phase rotation notification signal, the amplitude reduction unit 305 outputs the amplitude signal as it is. The output from the amplitude reduction unit 305 is inputted into the amplitude modulator 308. Note that the asymmetrical phase rotation unit 306 and the amplitude reduction unit 305 may be collectively referred to as an asymmetrical phase rotation unit 310.

Figure 7:
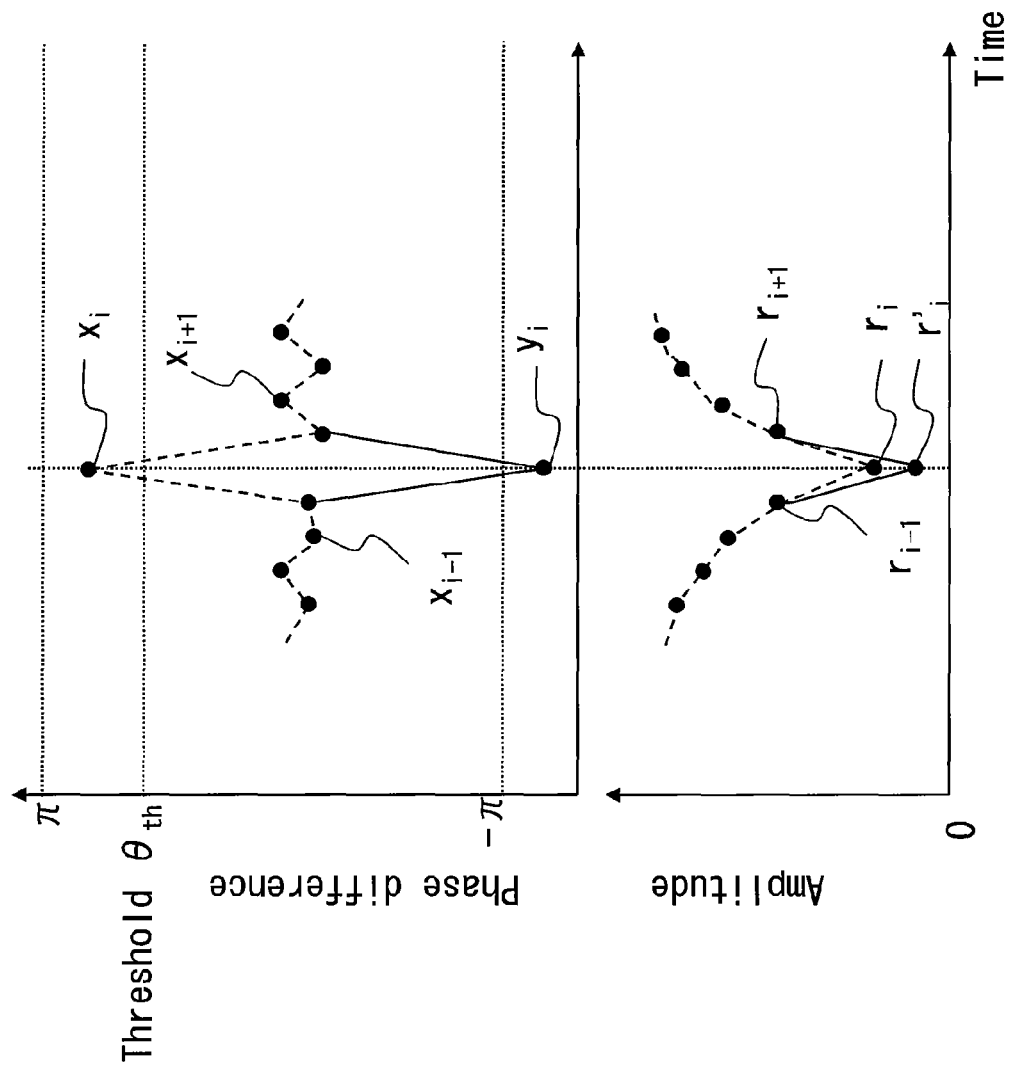
FIG. 7 shows operations performed by the transmission circuit according to the third embodiment of the present invention.

FIG. 7 illustrates an operation which the asymmetrical phase rotation unit 306 performs on the phase difference signal and an operation which the amplitude reduction unit 305 performs on the amplitude signal. In FIG. 7, the horizontal axes each represent time. The vertical axis in the upper part of FIG. 7 represents phase difference and the vertical axis in the lower part of FIG. 7 represents amplitude. In the upper part of FIG. 7, points connected with dashed lines represent values $x_n$ (n=1, 2, 3 ...) of the phase difference signal inputted into the asymmetrical phase rotation unit 306, which are obtained at different time points, respectively. Here, since $x_i$ is greater than $\theta_{th}$, the asymmetrical phase rotation unit 306 performs the phase rotation with $y_i = x_i - 2\pi$. The asymmetrical phase rotation unit 306 outputs the phase rotation notification signal to the amplitude reduction unit 305 at the timing of performing the phase rotation on $x_i$. In the lower part of FIG. 7, points connected with dashed lines represent amplitudes $r_n$ (n=1, 2, 3 ...) indicated by the amplitude signal inputted into the amplitude reduction unit 305, the amplitudes $r_n$ corresponding to the respective symbols. The amplitude reduction unit 305 detects the phase rotation notification signal. Accordingly, the amplitude reduction unit 305 reduces an amplitude signal $r_i$ corresponding to the ith symbol. The resultant amplitude signal is $r'_i$. The manner of reducing the amplitude signal $r_i$ is by dividing the original amplitude thereof by a positive fixed number, or subtracting a positive fixed number from the original amplitude.

In this manner, the amplitude of the symbol for which the phase rotation has been performed is reduced. This provides an advantageous effect in which distortion that may occur due to the phase rotation is reduced. In the present embodiment, the asymmetrical phase rotation unit 306 performs the phase rotation as represented by (equation 1). However, the same distortion reduction effect can also be obtained by performing any one of the phase rotations represented by (equation 2) to (equation 4).

Fourth Embodiment

Figure 8:
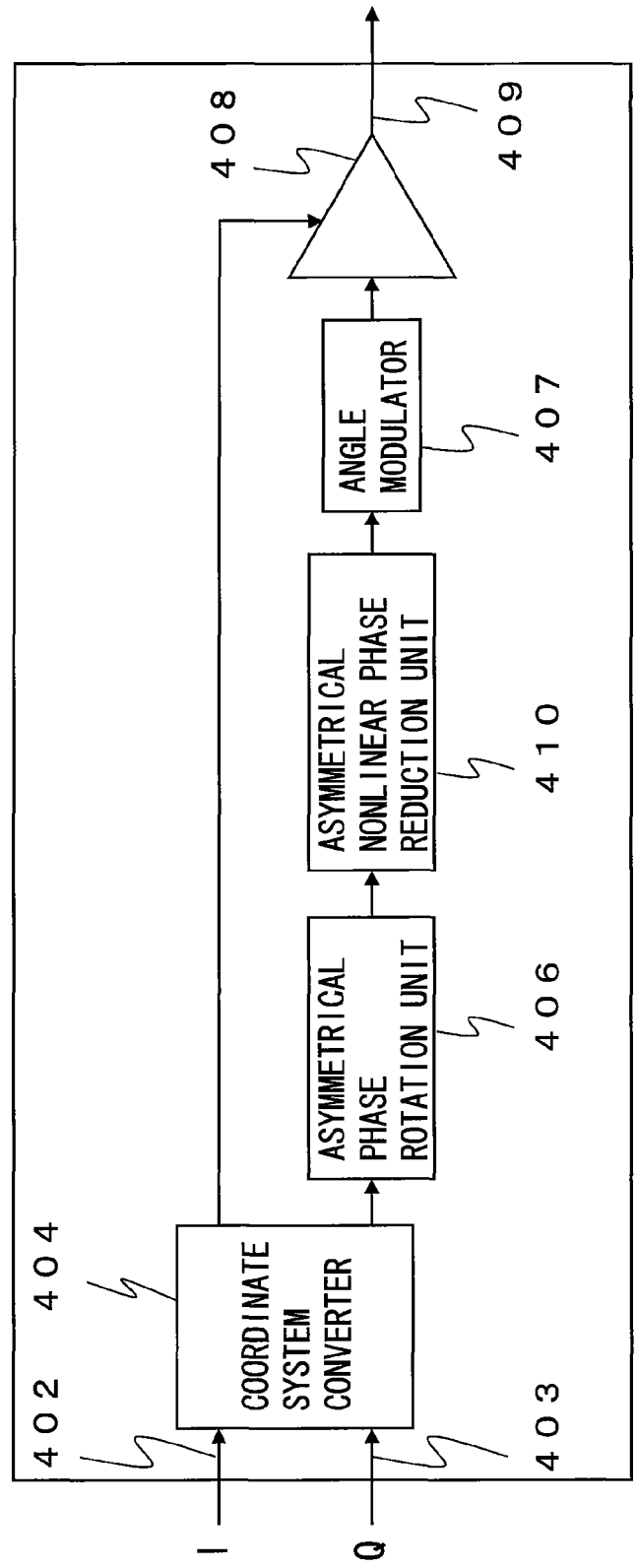
FIG. 8 shows a configuration of a transmission circuit according to a fourth embodiment of the present invention.

FIG. 8 is a block diagram showing a transmission circuit 401 according to a fourth embodiment of the present invention. The transmission circuit 401 includes input terminals 402 and 403, a coordinate system converter 404, an asymmetrical phase rotation unit 406, an asymmetrical nonlinear phase reduction unit 410, an angle modulator 407, an amplitude modulator 408, and an output terminal 409. Among these components, the input terminals 402 and 403, the coordinate system converter 404, the asymmetrical phase rotation unit 406, the angle modulator 407, the amplitude modulator 408, and the output terminal 409 are the same as the components of the transmission circuit 101 of the first embodiment. Therefore, the description thereof will be omitted.

The asymmetrical nonlinear phase reduction unit 410 receives the phase difference signal outputted from the asymmetrical phase rotation unit 406. The asymmetrical nonlinear phase reduction unit 410 performs a predetermined operation on the phase difference signal, and outputs the resultant signal to the angle modulator 407. Although the predetermined operation is the same as that disclosed in US patent application publication No. 2007/0149148 and that disclosed in US patent application publication No. 2007/0110184, the predetermined operation is described below. Note that the disclosure of US patent application publication No. 2007/0149148 and US patent application publication No. 2007/0110184 are incorporated herein by reference.

Figure 9:
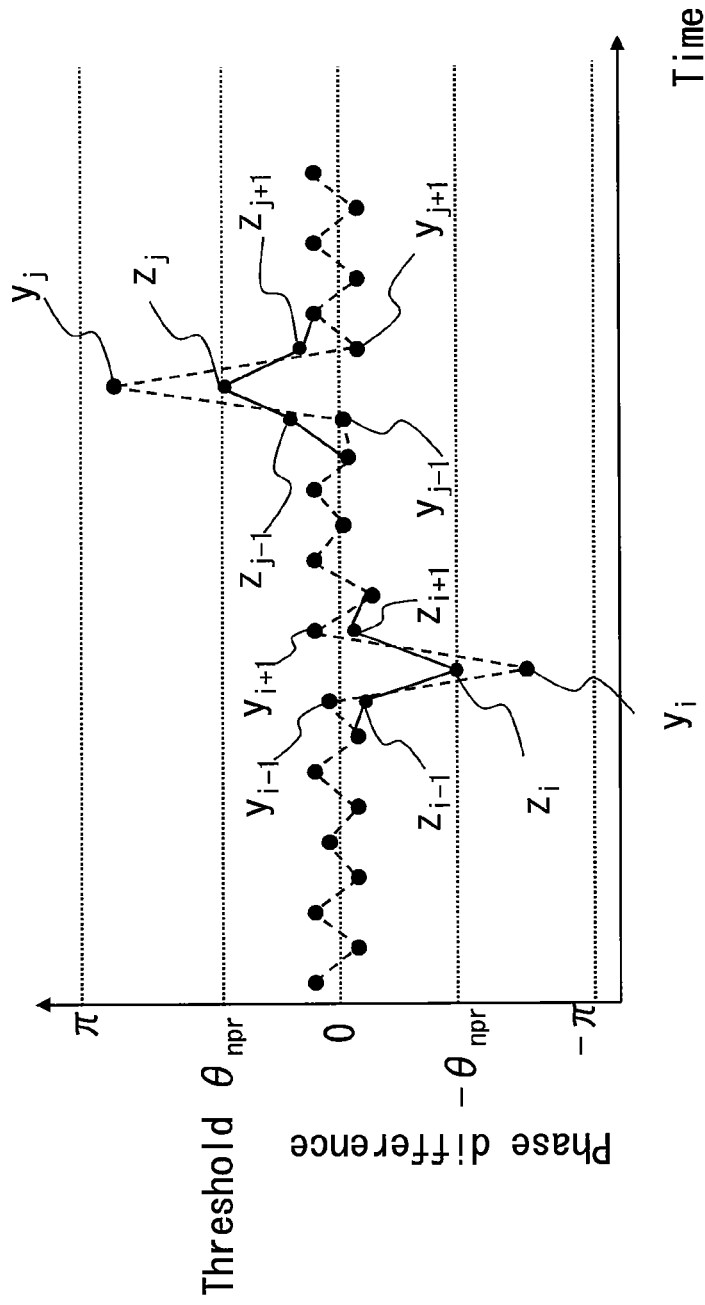
FIG. 9 shows an operation performed by the transmission circuit according to the fourth embodiment of the present invention.

FIG. 9 illustrates the operation which the asymmetrical nonlinear phase reduction unit 410 performs on the phase difference signal outputted from the asymmetrical phase rotation unit 406. In FIG. 9, the horizontal axis represents time and the vertical axis represents phase difference. In FIG. 9, points connected with dashed lines represent values $y_n$ (n=1, 2, 3 ...) of the phase difference signal inputted into the asymmetrical nonlinear phase reduction unit 410, which are obtained at different time points, respectively. The asymmetrical nonlinear phase reduction unit 410 performs the below operation for each n, based on each value and a predetermined threshold value $\theta_{npr}$ ($\pi > \theta_{npr} > 0$), and outputs a resultant value $z_n$.

If                                                       [equation 5]

$$y_n < -\theta_{npr}$$

$$z_n = -\theta_{npr}$$

$$z_{n-1} = y_{n-1} - \frac{-\theta_{npr} - y_n}{2}$$

$$z_{n+1} = y_{n+1} - \frac{-\theta_{npr} - y_n}{2}$$

If $$y_n > \theta_{npr}$$

$$z_n = \theta_{npr}$$

$$z_{n-1} = y_{n-1} - \frac{\theta_{npr} - y_n}{2}$$

$$z_{n+1} = y_{n+1} - \frac{\theta_{npr} - y_n}{2}$$

If $$\theta_{npr} \geq y_n \geq -\theta_{npr}$$

$$z_n = y_n$$

To be specific, when a phase difference indicated by a value $y_n$ of the phase difference signal inputted into the asymmetrical nonlinear phase reduction unit 410 is greater than $\theta_{npr}$, the asymmetrical nonlinear phase reduction unit 410 replaces $y_n$ with $\theta_{npr}$. On the other hand, when the phase difference indicated by $y_n$ is less than $-\theta_{npr}$, the asymmetrical nonlinear phase reduction unit 410 corrects $y_n$ into $-\theta_{npr}$. Then, the variation generated by the correction is allocated to a value $y_{n-1}$ of the phase difference signal, which precedes $y_n$, and a value $y_{n+1}$ of the phase difference signal, which follows $y_n$. That is, an integral value based on $z_n$ is compensated for, such that a difference from an integral value based on $y_n$ is not accumulated. When the phase difference indicated by the value $y_n$ of the phase difference signal inputted into the asymmetrical nonlinear phase reduction unit 410 is no less than $-\theta_{npr}$ and no more than $\theta_{npr}$, the asymmetrical nonlinear phase reduction unit 410 outputs the value $y_n$ of the phase difference signal as it is. FIG. 9 shows a case where $y_n$ is less than $-\theta_{npr}$ and $y_j$ is greater than $\theta_{npr}$. The variation in the phase difference signal after the operation is performed is more gradual than that before the operation is performed.

The asymmetrical nonlinear phase reduction unit 410 performs the above-described operation. Accordingly, even if there is a steep change in the phase difference signal outputted from the asymmetrical phase rotation unit 406, the steep change is mitigated. This allows the control range of a voltage controlled oscillator (VCO) or a digitally controlled oscillator (DCO) included in the angle modulator 407 to be reduced, and suppresses the spectrum from being widened. Thus, distortion is further reduced. Note that the asymmetrical phase rotation unit 406 used here may be either the asymmetrical phase rotation unit 106 according to the first embodiment or the asymmetrical phase rotation unit 206 according to the second embodiment. The asymmetrical phase rotation unit 406 may be provided between the asymmetrical phase rotation unit 306 and the angle modulator 308 in the transmission circuit 301 according to the third embodiment. It has been described that when the value $y_n$ is replaced with the threshold value, the correction is performed on the values $y_{n-1}$ and $y_{n+1}$ of the phase difference signal, which precede and follow $y_n$ by 1. However, the present invention is not limited thereto. The correction may be performed on two or more values of the phase difference signal that precede $y_n$ and on two or more values of the phase difference signal that follow $y_n$. Here, as long as the total sum of the correction amounts is equal to the difference value between $y_n$ and the threshold value, the sum of the amounts corrected by the correction performed on the values of the phase difference signal that precede $y_n$ and the sum of the amounts corrected by the correction performed on the values of the phase difference signal that follow $y_n$ do not have to be equal to each other.

Fifth Embodiment

Figure 10:
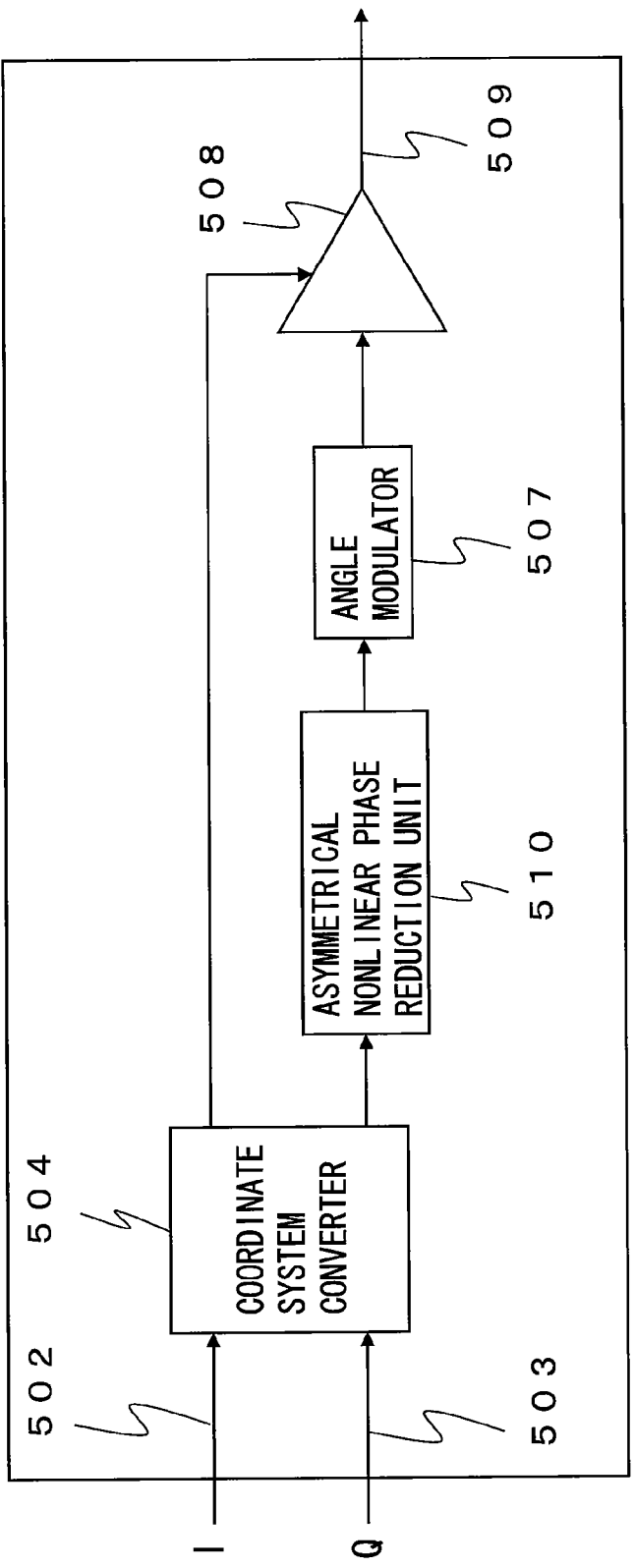
FIG. 10 shows a configuration of a transmission circuit according to a fifth embodiment of the present invention.

FIG. 10 is a block diagram showing a transmission circuit 501 according to a fifth embodiment of the present invention. The transmission circuit 501 includes input terminals 502 and 503, a coordinate system converter 504, an asymmetrical nonlinear phase reduction unit 510, an angle modulator 507, an amplitude modulator 508, and an output terminal 509. The transmission circuit 501 is different from the transmission circuit 401 according to the fourth embodiment in that the transmission circuit 501 does not include the asymmetrical phase rotation unit 406 and the asymmetrical nonlinear phase reduction unit 510 performs an operation different from that performed by the asymmetrical nonlinear phase reduction unit 410.

Figure 11:
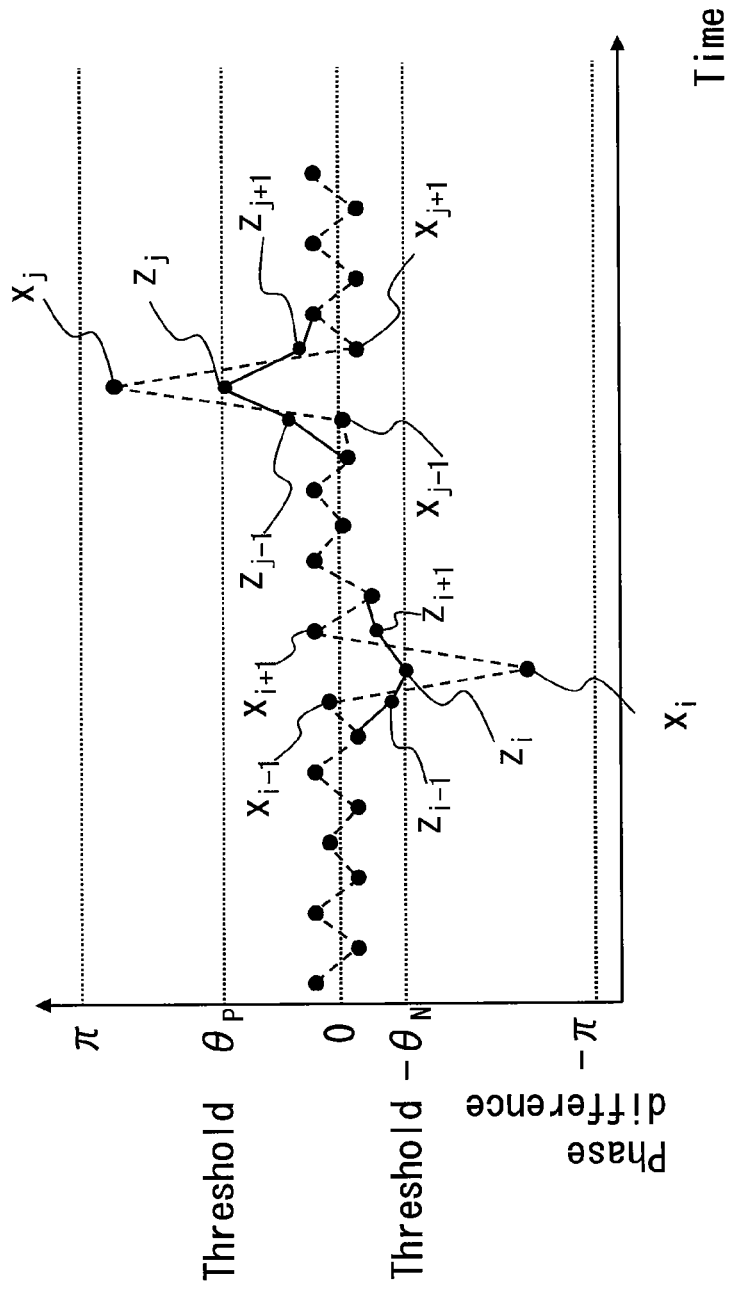
FIG. 11 shows an operation performed by the transmission circuit according to the fifth embodiment of the present invention.

The phase difference signal outputted from the coordinate system converter 504 is inputted into the asymmetrical nonlinear phase reduction unit 510. FIG. 11 illustrates the operation that the asymmetrical nonlinear phase reduction unit 510 performs on the inputted phase difference signal. In FIG. 11, the horizontal axis represents time and the vertical axis represents phase difference. In FIG. 11, points connected with dashed lines represent values $x_n$ (n=1, 2, 3 . . . ) of the phase difference signal inputted into the asymmetrical nonlinear phase reduction unit 510, which are obtained at different time points, respectively. The asymmetrical nonlinear phase reduction unit 510 performs the below operation for each n, based on each value $x_n$ and two different predetermined threshold values $\theta_N$ and $\theta_P$ ($\pi > \theta_N > 0$, $\pi > \theta_P > 0$), and outputs a resultant value $z_n$.

If                                                       [equation 6]

$$x_n < -\theta_N$$

$$z_n = -\theta_N$$

$$z_{n-1} = x_{n-1} - \frac{-\theta_N - x_n}{2}$$

$$z_{n+1} = x_{n+1} - \frac{-\theta_N - x_n}{2}$$

If $$x_n > \theta_P$$

$$z_n = \theta_P$$

$$z_{n-1} = x_{n-1} - \frac{\theta_P - x_n}{2}$$

$$z_{n+1} = x_{n+1} - \frac{\theta_P - x_n}{2}$$

If $$\theta_P \geq x_n \geq -\theta_N$$

$$z_n = x_n$$

To be specific, the asymmetrical nonlinear phase reduction unit 410 according to the fourth embodiment performs the operation based on a threshold value, the absolute value of which is the same ($\pm\theta_{npr}$) regardless of the value $x_n$ being positive or negative. In contrast, the absolute value of the threshold value on which the asymmetrical nonlinear phase reduction unit 510 according to the present embodiment bases its operation, is different ($\theta_p$ or $-\theta_n$) depending on whether the value $x_n$ is positive or negative. FIG. 11 shows a case where $x_i$ is less than $-\theta_N$ and $x_j$ is greater than $\theta_N$. As with the operation of the fourth embodiment, the variation in the phase difference signal after the operation has been performed is more gradual than that before the operation is performed. Also, an integral value based on $z_n$ is compensated for, such that a difference from an integral value based on $x_n$ is not accumulated. Here, it will be understood that the fifth embodiment is different from the fourth embodiment in that the distribution range of values of the phase difference signal is different between the positive region and the negative region. Accordingly, the spectrum can be suppressed from being widened on the higher frequency side and the lower frequency side in an asymmetrical manner. As a result, when distortion reduction is more strictly required for one frequency side than for the other frequency side, the distortion on the one frequency side can be reduced at a greater degree. For example, when a greater distortion reduction is required for the higher frequency side, $\theta_P$ may be reduced. On the other hand, when a greater distortion reduction is required for the lower frequency side, $\theta_N$ may be reduced. It has been described that when the value $x_n$ is replaced with the threshold value, the correction is performed on the value $x_{n-1}$ of the phase difference signal which precedes $x_n$ by 1 and on the value $x_{n+1}$ of the phase difference signal which follows $x_n$ by 1. However, the present invention is not limited thereto. The correction may be performed on two or more values of the phase difference signal that precede $x_n$ and on two or more values of the phase difference signal that follow $x_n$. Here, as long as the total sum of the correction amounts is equal to the difference value between $x_n$ and the threshold value, the sum of the amounts corrected by the correction performed on the values of the phase difference signal that precede $x_n$ and the sum of the amounts corrected by the correction performed on the values of the phase difference signal that follow $x_n$ do not have to be equal to each other.

Note that, in the transmission circuit 401 of the fourth embodiment, the asymmetrical nonlinear phase reduction unit 510 can be used in place of the asymmetrical nonlinear phase reduction unit 410.

In the first to fifth embodiments, when a substantial phase shift or a substantial amplitude shift occurs due to the operation, a symbol position may be located beyond a symbol boundary, causing a modulation error. This error is tolerable if the error can be corrected at the receiving end. If the absolute value of each threshold value used in the above embodiments is excessively large, the number of symbols of the phase difference signal, for which the phase rotation direction is to be inverted and the steep change is to be mitigated, is reduced, and the effect to be obtained is reduced, accordingly. On the other hand, if the absolute value of each threshold value is excessively small, this results in occurrence of distortion. In particular, the distortion reduction effect near the carrier wave band decreases. Attention should be paid to these points when the threshold values are determined. Appropriate threshold values may be selected in accordance with the band, output power, and the like of a transmission path for the transmission signal and of other transmission/reception paths whose interference with the transmission path is required to be prevented.

Sixth Embodiment

Figure 12:
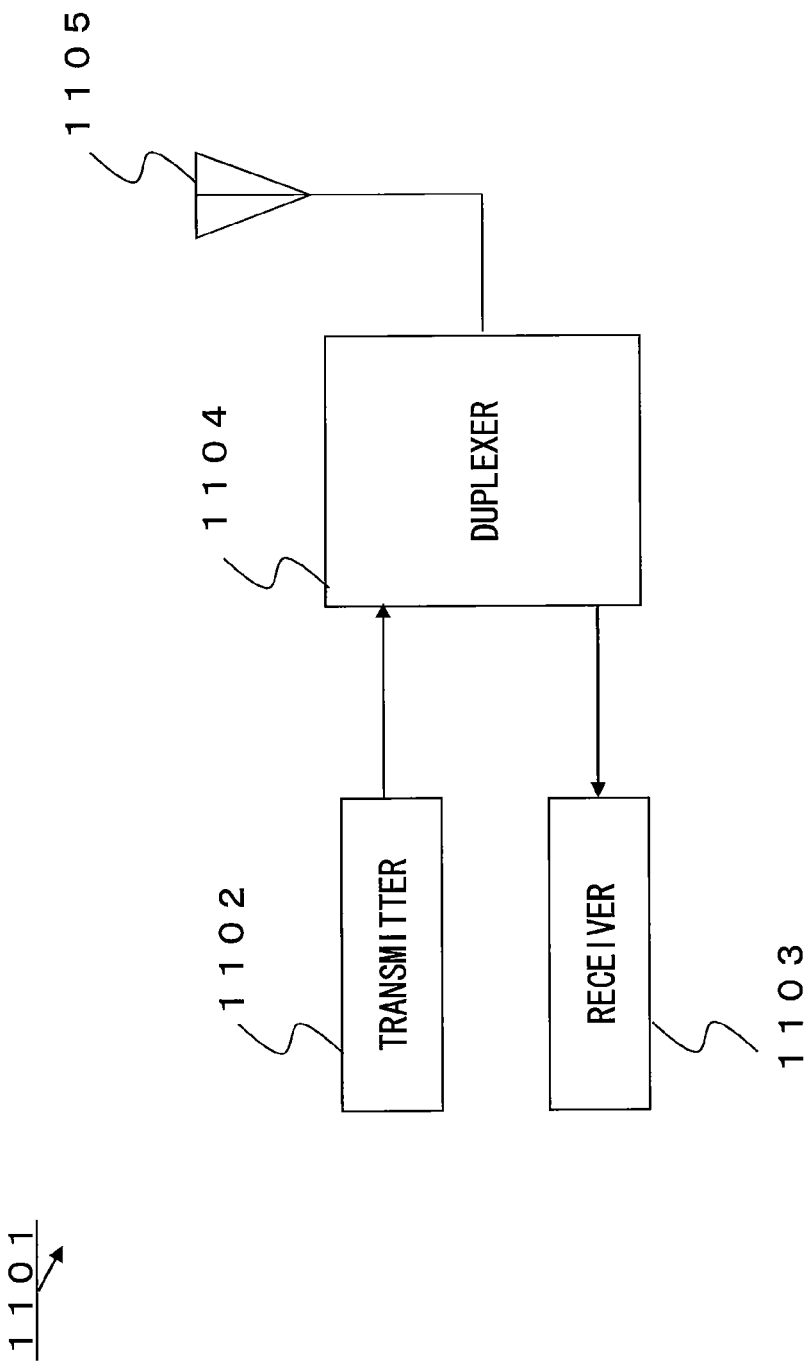
FIG. 12 shows a configuration of a radio communication device according to a sixth embodiment of the present invention.
Figure 13:
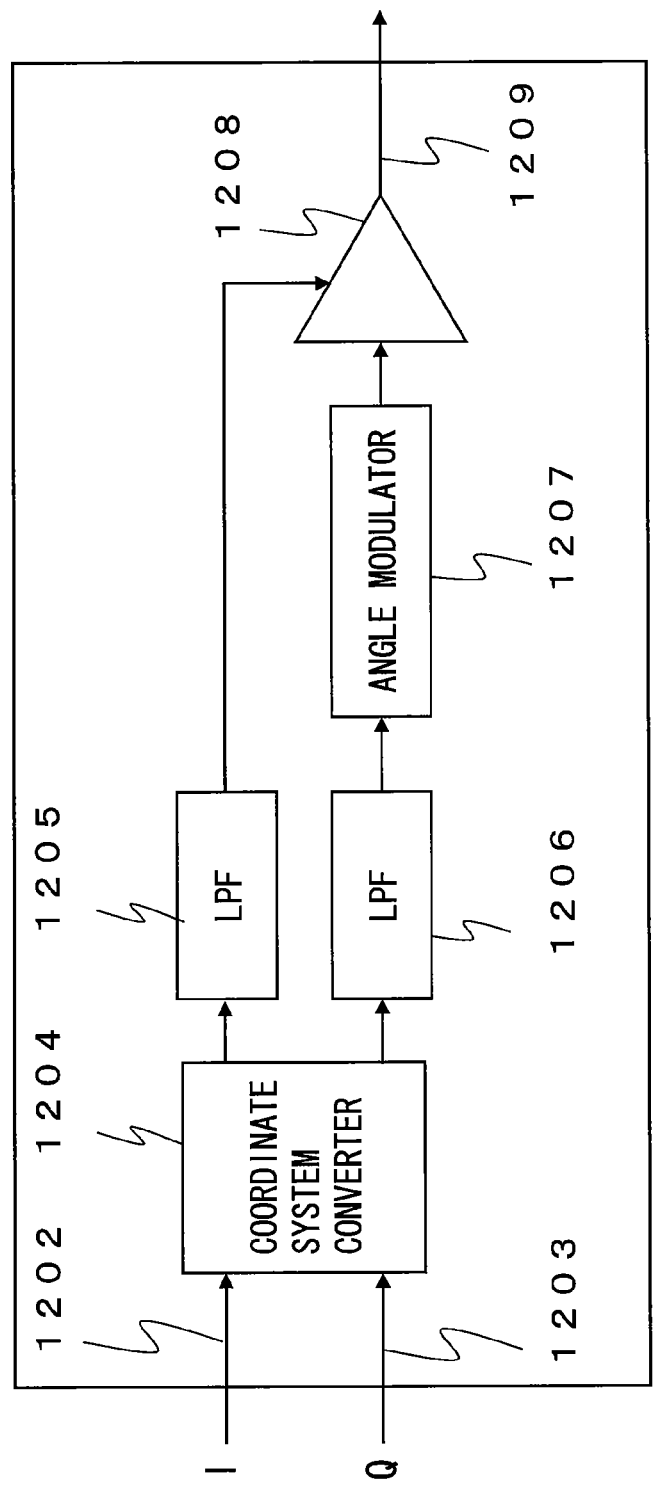
FIG. 13 shows a configuration of a conventional transmission circuit.
Figure 14:
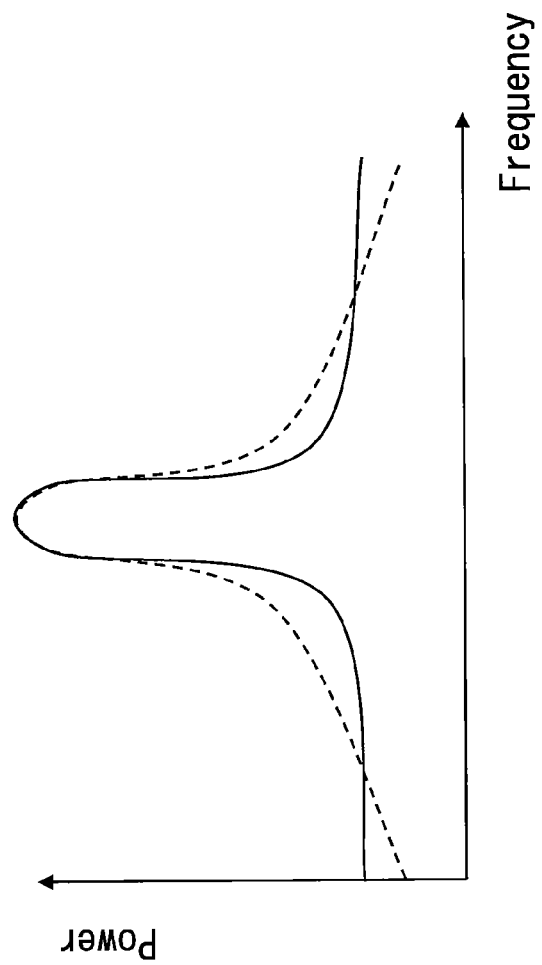
FIG. 14 shows power spectra of output signals of the conventional transmission circuit.

A sixth embodiment of the present invention is a radio communication device 1101 that uses, as a transmitter 1102, one of the transmission circuits 101, 201, 301, 401, and 501 according to the first to fifth embodiments. FIG. 12 shows a block configuration of the radio communication device 1101. The radio communication device 1101 includes the transmitter 1102, a receiver 1103, a duplexer 1104 and an antenna 1105. The transmission signal outputted from the transmitter 1102 is inputted into the antenna 1105 via the duplexer 1104, and radiated from the antenna 1105. A reception signal is inputted into the antenna 1105, and inputted into the receiver 1103 via the duplexer 1104. The receiver 1103 demodulates the reception signal. Note that the radio communication device 1101 may include an antenna switch in place of the duplexer 1104.

As described above, the present invention realizes a transmission circuit and a radio communication device capable of generating and outputting a transmission signal that has, on the higher or lower frequency side with respect to the carrier wave band, favorable distortion characteristics in a band near the carrier wave band as well as in a band distant from the carrier wave band.

The components of each transmission circuit and the radio communication device according to the embodiments may be partly or entirely realized as an LSI. These components may be realized as a single chip or multiple chips. Although LSI is mentioned here, it may be alternatively referred to as IC, system LSI, super LSI, or ultra LSI, depending on the integration density thereof. Alternatively, the functions of these components may be executed, at least partly, by a CPU, for example. Further, steps to be performed by such a CPU may be stored as a program in a computer readable storage medium. Moreover, in the radio communication device, in order to form the antenna as a phased array antenna, the antenna may be in LSI form. The present invention is also directed to a method for realizing the above-described functions of the transmission circuit.

INDUSTRIAL APPLICABILITY

The present invention is useful for radio communication devices such as mobile phones and wireless LAN devices.

While the invention has been described in detail, the foregoing description is in all aspects illustrative and not restrictive. It will be understood that numerous other modifications and variations can be devised without departing from the scope of the invention.

What is claimed is:

1. An asymmetrical phase rotation device into which a phase difference signal, which is a difference between a phase signal and its immediately previous phase signal measured in radians, is inputted, for performing an operation on the phase difference signal and outputting a resultant signal, comprising:

a coordinate system converter that separates an input signal into a phase signal and generates a phase difference signal by calculating in radians a difference between the separated phase signal and the phase signal separated immediately previously thereto, and outputs the phase difference signal; and an asymmetrical phase rotation unit for performing one of an operation of subtracting $2\pi$ radians from a value of the phase difference signal when the value of the phase difference signal is greater than a predetermined positive threshold value; and an operation of adding $2\pi$ radians to the value of the phase difference signal when the value of the phase difference signal is less than a predetermined negative threshold value, wherein when performing the operation of subtracting $2\pi$ radians from the value of the phase difference signal, the asymmetrical phase rotation unit further performs an operation of adding a positive value to a predetermined number of values of the phase difference signal that precede the value of the phase difference signal and adding a positive value to a predetermined number of values of the phase difference signal that follow the value of the phase difference signal, the total of the positive values being $2\pi$ radians, and when performing the operation of adding $2\pi$ radians to the value of the phase difference signal, the asymmetrical phase rotation unit further performs an operation of subtracting a positive value from a predetermined number of values of the phase difference signal that precede the value of the phase difference signal and subtracting a positive value from a predetermined number of values of the phase difference signal that follow the value of the phase difference signal, the total of the positive values being $2\pi$ radians.

2. An asymmetrical phase rotation device into which a phase difference signal, which is a difference between a phase signal and its immediately previous phase signal measured in radians, is inputted, for performing an operation on the phase difference signal and outputting a resultant signal, comprising:

an asymmetrical phase rotation unit for performing one of an operation of subtracting $2\pi$ radians from a value of the phase difference signal when the value of the phase difference signal is greater than a predetermined positive threshold value and an operation of adding $2\pi$ radians to the value of the phase difference signal when the value of the phase difference signal is less than a predetermined negative threshold value; and an amplitude reduction unit that performs an operation on an amplitude signal inputted thereinto and outputs a resultant signal, and the amplitude reduction unit performs an operation of reducing an amplitude of the amplitude signal when the operation of subtracting $2\pi$ radians from the value of the phase difference signal or the operation of adding $2\pi$ radians to the value of the phase difference signal has been performed.

3. A transmission circuit for modulating an input signal to generate a transmission signal and outputting the transmission signal, the transmission circuit comprising:

a coordinate system converter that separates the input signal into a phase signal and an amplitude signal, generates a phase difference signal by calculating in radians a difference between the separated phase signal and the phase signal separated immediately previously thereto, and outputs the phase difference signal and the amplitude signal;

an asymmetrical phase rotation unit into which the phase difference signal is inputted and which performs one of an operation of subtracting $2\pi$ radians from a value of the phase difference signal when the value of the phase difference signal is greater than a predetermined positive threshold value and an operation of adding $2\pi$ radians to the value of the phase difference signal when the value of the phase difference signal is less than a predetermined negative threshold value;

an angle modulator that performs, based on the phase difference signal outputted from the asymmetrical phase rotation unit, angle modulation to generate an angle-modulated signal, and outputs the angle-modulated signal; and an amplitude modulator that performs, based on an amplitude represented by the amplitude signal, amplitude modulation on the angle-modulated signal to generate the transmission signal, and outputs the transmission signal.

4. The transmission circuit according to claim 3, wherein when performing the operation of subtracting $2\pi$ radians from the value of the phase difference signal, the asymmetrical phase rotation unit further performs an operation of adding a positive value to a predetermined number of values of the phase difference signal that precede the value of the phase difference signal and adding a positive value to a predetermined number of values of the phase difference signal that follow the value of the phase difference signal, the total of the positive values being $2\pi$ radians, and when performing the operation of adding $2\pi$ radians to the value of the phase difference signal, the asymmetrical phase rotation unit further performs an operation of subtracting a positive value from a predetermined number of values of the phase difference signal that precede the value of the phase difference signal and subtracting a positive value from a predetermined number of values of the phase difference signal that follow the value of the phase difference signal, the total of the positive values being $2\pi$ radians.

5. The transmission circuit according to claim 3, wherein the asymmetrical phase rotation unit includes an amplitude reduction unit into Which the amplitude signal is inputted and which performs an operation on the amplitude signal and outputs a resultant signal, and the amplitude reduction unit performs an operation of reducing the amplitude of the amplitude signal when the operation of subtracting $2\pi$ radians from the value of the phase difference signal or the operation of adding $2\pi$ radians to the value of the phase difference signal has been performed.

6. A transmission circuit for modulating an input signal to generate a transmission signal and outputting the transmission signal, the transmission circuit comprising:

a coordinate system converter that separates the input signal into a phase signal and an amplitude signal, generates a phase difference signal by calculating in radians a difference between the separated phase signal and the phase signal separated immediately previously thereto, and outputs the phase difference signal and the amplitude signal;

an asymmetrical phase rotation unit into which the phase difference signal is inputted and which performs one of an operation of subtracting $2\pi$ radians from a value of the phase difference signal when the value of the phase difference signal is greater than a predetermined positive threshold value and an operation of adding $2\pi$ radians to the value of the phase difference signal when the value of the phase difference signal is less than a predetermined negative threshold value;

an asymmetrical nonlinear phase reduction unit into which the phase difference signal outputted from the asymmetrical phase rotation unit is inputted and which performs an operation of replacing, when a value of the phase difference signal is greater than a predetermined positive threshold value, the value of the phase difference signal with the predetermined positive threshold value, and an operation of adding a positive value to a predetermined number of values of the phase difference signal that precede the replaced value of the phase difference signal and adding a positive value to a predetermined number of values of the phase difference signal that follow the replaced value of the phase difference signal, the total of the positive values being equal to a difference value between the replaced value of the phase difference signal and the predetermined positive threshold value, and an operation of replacing, when a value of the phase difference signal is less than a, predetermined negative threshold value, the value of the phase difference signal with the predetermined negative threshold value, and an operation of subtracting a positive value from a predetermined number of values of the phase difference signal that precede the replaced value of the phase difference signal and subtracting a positive value from a predetermined number of values of the phase difference signal that follow the replaced value of the phase difference signal, the total of the positive values being equal to a difference value between the replaced value of the phase difference signal and the predetermined negative threshold value;

an angle modulator that performs, based on the phase difference signal that is outputted from the asymmetrical nonlinear phase reduction unit and that has been subjected to phase reduction processing by the asymmetrical nonlinear phase reduction unit, angle modulation to generate an angle-modulated signal, and outputs the angle-modulated signal; and an amplitude modulator that performs, based on an amplitude represented by the amplitude signal, amplitude modulation on the angle-modulated signal to generate the transmission signal, and outputs the transmission signal.

7. The transmission circuit according to claim 6, wherein when performing the operation of subtracting $2\pi$ radians from the value of the phase difference signal, the asymmetrical phase rotation unit further performs an operation of adding a positive value to a predetermined number of values of the phase difference signal that precede the value of the phase difference signal and adding a positive value to a predetermined number of values of the phase difference signal that follow the value of the phase difference signal, the total of the positive values being $2\pi$ radians, and when performing the operation of adding $2\pi$ radians to the value of the phase difference signal, the asymmetrical phase rotation unit further performs an operation of subtracting a positive value from a predetermined number of values of the phase difference signal that precede the value of the phase difference signal and subtracting a positive value from a predetermined number of values of the phase difference signal that follow the value of the phase difference signal, the total of the positive values being $2\pi$ radians.

8. An asymmetrical nonlinear phase reduction device, into which a phase difference signal, which is a difference between a phase signal and a phase signal immediately previous thereto measured in radians, is inputted, for performing an operation on the phase difference signal and outputting a resultant signal, comprising:

a coordinate system converter that separates an input signal into a phase signal and generates a phase difference signal by calculating in radians a difference between the separated phase signal and the phase signal separated immediately previously thereto, and outputs the phase difference signal; and an asymmetrical nonlinear phase reduction unit performing one of:

an operation of replacing, when a value of the phase difference signal is greater than a predetermined positive threshold value, the value of the phase difference signal with the predetermined positive threshold value, and an operation of adding a positive value to a predetermined number of values of the phase difference signal that precede the replaced value of the phase difference signal and adding a positive value to a predetermined number of values of the phase difference signal that follow the replaced value of the phase difference signal, the total of the positive values being equal to a difference value between the replaced value of the phase difference signal and the predetermined positive threshold value, an operation of replacing, when a value of the phase difference signal is less than a predetermined negative threshold value whose absolute value is different from that of the predetermined positive threshold value, the value of the phase difference signal with the predetermined negative threshold value, and an operation of subtracting a positive value from a predetermined number of values of the phase difference signal that precede the replaced value of the phase difference signal and subtracting a positive value from a predetermined number of values of the phase difference signal that follow the replaced value of the phase difference signal, the total of the positive values being equal to a difference value between the replaced value of the phase difference signal and the predetermined negative threshold value.

9. A transmission circuit for modulating an input signal to generate a transmission signal and outputting the transmission signal, the transmission circuit comprising:

a coordinate system converter that separates the input signal into a phase signal and an amplitude signal, generates a phase difference signal by calculating in radians a difference between the separated phase signal and the phase signal separated immediately previously thereto, and outputs the phase difference signal and the amplitude signal;

an asymmetrical nonlinear phase reduction unit into which the phase difference signal is inputted and which performs an operation of replacing, when a value of the phase difference signal is greater than a predetermined positive threshold value, the value of the phase difference signal with the predetermined positive threshold value, and an operation of adding a positive value to a predetermined number of values of the phase difference signal that precede the replaced value of the phase difference signal and adding a positive value to a predetermined number of values of the phase difference signal that follow the replaced value of the phase difference signal, the total of the positive values being equal to a difference value between the replaced value of the phase difference signal and the predetermined positive threshold value, and an operation of replacing, when a value of the phase difference signal is less than a predetermined negative threshold value whose absolute value is different from that of the predetermined positive threshold value, the value of the phase difference signal with the predetermined negative threshold value, and an operation of subtracting a positive value from a predetermined number of values of the phase difference signal that precede the replaced value of the phase difference signal and subtracting a positive value from a predetermined number of values of the phase difference signal that follow the replaced value of the phase difference signal, the total of the positive values being equal to a difference value between the replaced value of the phase difference signal and the predetermined negative threshold value;

an angle modulator that performs, based on the phase difference signal outputted from the asymmetrical nonlinear phase reduction unit, angle modulation to generate an angle-modulated signal, and outputs the angle-modulated signal; and an amplitude modulator that performs, based on an amplitude represented by the amplitude signal, amplitude modulation on the angle-modulated signal to generate the transmission signal, and outputs the transmission signal.

10. A transmission signal generation method used by a transmission circuit that comprises a processor and a power amplifier and that modulates an input signal to generate and output a transmission signal, the transmission signal generation method comprising:

a coordinate conversion step at which the processor separates the input signal into a phase signal and an amplitude signal, and generates a phase difference signal by calculating in radians a difference between the separate phase signal and the phase signal separated immediately previously thereto;

an asymmetrical phase rotation step at which the processor performs one of an operation of subtracting $2\pi$ radians from a value of the phase difference signal when the value of the phase difference signal is greater than a predetermined positive threshold value, and an operation of adding $2\pi$ radians to the value of the phase difference signal when the value of the phase difference signal is less than a predetermined negative threshold value;

an angle modulation step at which the processor performs angle modulation based on the phase difference signal after the asymmetrical phase rotation step has been performed, and generates an angle-modulated signal; and an amplitude modulation step at which the power amplifier performs, based on an amplitude represented by the amplitude signal, amplitude modulation on the angle-modulated signal to generate the transmission signal, and outputs the transmission signal.

11. A radio communication device for modulating an input signal, outputting a transmission signal, and demodulating a reception signal, the radio communication device comprising:

a transmitter that includes a coordinate system converter that separates the input signal into a phase signal and an amplitude signal, generates a phase difference signal by calculating in radians a difference between the separated phase signal and the phase signal separated immediately previously thereto, and outputs the phase difference signal and the amplitude signal, an asymmetrical phase rotation unit into which the phase difference signal is inputted and which performs one of an operation of subtracting $2\pi$ radians from a value of the phase difference signal when the value of the phase difference signal is greater than a predetermined positive threshold value and an operation of adding $2\pi$ radians to the value of the phase difference signal when the value of the phase difference signal is less than a predetermined negative threshold value, an angle modulator that performs, based on the phase difference signal outputted from the asymmetrical phase rotation unit, angle modulation to generate an angle-modulated signal, and outputs the angle-modulated signal, and an amplitude modulator that performs, based on an amplitude represented by the amplitude signal, amplitude modulation on the angle-modulated signal to generate the transmission signal, and outputs the transmission signal;

a receiver;

an antenna; and one of a duplexer and an antenna switch, wherein the transmitter and the receiver are connected to the antenna via the one of the duplexer and the antenna switch.

* * * * *